(12) United States Patent
Cheng et al.

(10) Patent No.: US 9,667,217 B2
(45) Date of Patent: May 30, 2017

(54) HIGH PERFORMANCE INTEGRATED TUNABLE IMPEDANCE MATCHING NETWORK WITH COUPLED MERGED INDUCTORS

(71) Applicant: Peregrine Semiconductor Corporation, San Diego, CA (US)

(72) Inventors: Chih-Chieh Cheng, Poway, CA (US); Tero Tapio Ranta, San Diego, CA (US); Richard Bryon Whatley, Carlsbad, CA (US); Vikram Sekar, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 6 days.

(21) Appl. No.: 14/690,212

(22) Filed: Apr. 17, 2015

(65) Prior Publication Data

US 2016/0308506 A1    Oct. 20, 2016

(51) Int. Cl.
*H03H 7/38* (2006.01)
*H03H 3/00* (2006.01)
*H01F 17/00* (2006.01)

(52) U.S. Cl.
CPC ........... *H03H 7/38* (2013.01); *H01F 17/0006* (2013.01); *H03H 2007/386* (2013.01)

(58) Field of Classification Search
CPC ...... H03H 3/00; H03H 7/38; H03H 2007/386; H01F 17/0006

USPC .......................................................... 333/32
See application file for complete search history.

(56) References Cited

U.S. PATENT DOCUMENTS

| | | | |
|---|---|---|---|
| 5,656,849 A | 8/1997 | Burghartz et al. | |
| 8,811,911 B2* | 8/2014 | Su .................. | H04B 1/0458 333/17.3 |
| 2005/0206470 A1* | 9/2005 | Lin .................. | H03H 7/09 333/24 R |
| 2011/0002080 A1 | 1/2011 | Ranta | |
| 2015/0097637 A1* | 4/2015 | Pye .................. | H03H 11/04 333/174 |
| 2017/0026021 A1 | 1/2017 | Cheng et al. | |

OTHER PUBLICATIONS

Ito, et al., "Characterization of On-Chip Mutliport Inductors for Small-Area RF Circuits", IEEE Transactions on Circuits and Systems-I: Regular Papers, vol. 56, No. 8, Aug. 2009, pp. 1590-1597.

* cited by examiner

*Primary Examiner* — Stephen E Jones
*Assistant Examiner* — Scott S Outten
(74) *Attorney, Agent, or Firm* — Jaquez Land Greenhaus LLP; Martin J. Jaquez, Esq.; John Land, Esq.

(57) ABSTRACT

A high performance integrated tunable impedance matching network with coupled merged inductors. Embodiments include a combination of merged multiport constructively coupled spiral inductors and tunable capacitors configured to reduce insertion losses, circuit size, and optimization time while maintaining a high Q factor for the coupled spiral inductors.

38 Claims, 6 Drawing Sheets

FIG. 6A
Mid-Band

FIG. 6B
Low-Band

FIG. 7

HIGH PERFORMANCE INTEGRATED TUNABLE IMPEDANCE MATCHING NETWORK WITH COUPLED MERGED INDUCTORS

BACKGROUND (1) Technical Field

This invention generally relates to electronic circuitry, and more specifically to tunable integrated impedance matching networks for use in electronic radio frequency circuits.

(2) Background

Radio frequency (RF) communication systems typically include "RF front-end" (RFFE) circuitry, which is a generic term for all of the circuitry between a radio antenna up to and including the mixer stage of a radio. Impedance matching (IM) networks are an essential building block in RFFE circuits in order to match the internal impedance of an RFFE (e.g., 2-3 ohms) to the nominal impedance value (typically 50 ohms) of the characteristic impedance of common RF systems.

Figure 1:
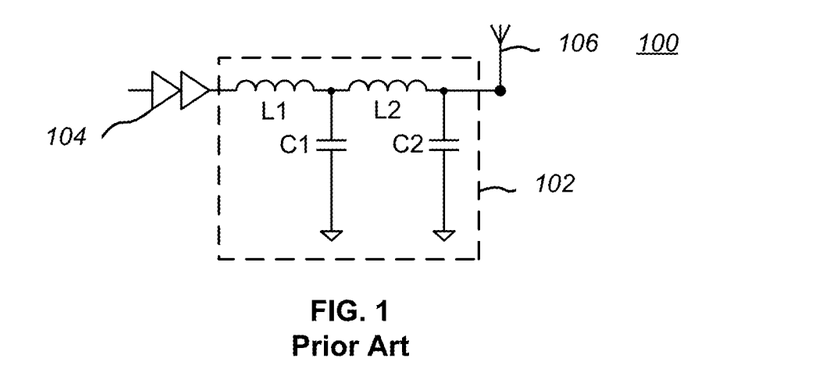
FIG. 1 is a schematic diagram of an RF front end including one type of prior art impedance matching network.

FIG. 1 is a schematic diagram of an RF front end 100 including one type of prior art impedance matching network 102. The IM network 102 is shown connected to a power amplifier 104 and an antenna 106. The illustrated IM network 102 includes two series-connected stages of inductors L1, L2, and corresponding shunt capacitors C1, C2 connected to circuit ground as shown. In other embodiments, more stages of inductors and shunt capacitors may be used. The values selected for L1, L2, C1, and C2 are design and system dependent, but the function and design of such IM networks 102 is well known in the art.

Figure 2:
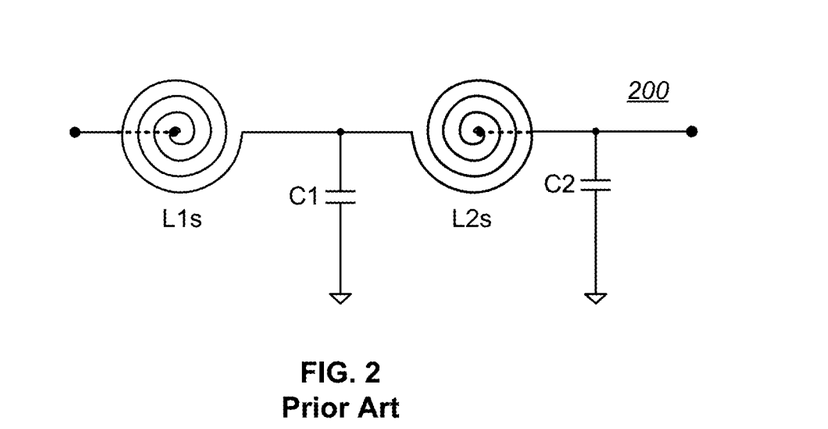
FIG. 2 is a schematic diagram showing one type of prior art impedance matching network having spiral inductors L1s, L2s shown in place of the inductors L1, L2 of FIG. 1.

When implemented with integrated circuit technology, the inductors used in typical RFFE's are commonly formed as 2-port spirals; examples of such spiral inductors are shown in U.S. Pat. No. 5,656,849. FIG. 2 is a schematic diagram showing one type of prior art impedance matching network 200 having spiral inductors L1s, L2s shown in place of the inductors L1, L2 of FIG. 1; the connection to the center port or tap of the spiral inductors L1s, L2s is shown as a dotted line. Note that the spiral inductors L1s, L2s are shown highly stylized as essentially Archimedean spirals; however, such inductors may be of various overall shapes and sizes so long as inductive loops (in the broadest sense) are formed, as is known in the art. For example, U.S. Pat. No. 5,656,849 illustrates spiral inductors with straight sides and right angle turns.

RF circuitry implemented in low-power integrated circuit (IC) technologies ("chips") such as CMOS has enabled increasingly more compact radio systems, such as cell phones and other RF-connected mobile devices. However, while transistors continue to shrink in size as fabrication process technology advances, passive devices such as inductors have not scaled down at the same rate. In particular, on-chip inductors used in RF circuits tend to be the most area-consuming devices, especially since the layout area of IC inductors is not determined by the feature size of an implementing CMOS process but rather upon such factors as the RF carrier frequency, the data rate of the circuit, desired and sufficient inductor Q factor, etc. Further, each inductor often requires long hours of optimization time. Multiband RF front-end circuitry typically uses many inductors to obtain wideband characteristics, resulting in large IC chip (die) sizes and large expenditures of optimization time. Notably, a large IC die size produce smaller yields per semiconductor wafer than smaller IC dies, thus increasing the production cost per die.

Another problem with inductors is that of mutual inductive coupling, in which the flow of current in one inductor (e.g., L1 or L1s) induces a voltage in a nearby inductor (e.g., L2 or L2s), and vice versa. Conventional designs generally try to minimize inductive coupling by physically spacing inductors apart (which often leads to larger IC chip sizes), or by designing the inductors to destructively couple (i.e., have currents flow in opposite directions) to minimize the adverse effects of mutual inductance. In spiral conductors, destructive coupling is generally accomplished by having adjacent inductors wind in opposite directions, as suggested by the winding direction of the spiral inductors L1s and L2s in FIG. 2.

It would be desirable to be able to reduce the size of inductor-based IM matching networks to shrink overall circuit size and reduce production costs, while maintaining high performance and without the adverse effects of mutual inductive coupling as may occur in conventional designs. The present invention accomplishes these goals.

SUMMARY OF THE INVENTION

Multi-mode, multi-band integrated circuit RFFE's are commonly used in mobile devices. As a result, impedance matching (IM) networks with multiple inductors can be found in many places in such RFFEs, for example, for antenna and power amplifier impedance matching. Accordingly, it is desirable to shrink the die size, reduce the cost, and simplify the design of IC's embodying such RFFE's while maintaining high performance and without the adverse effects of mutual inductive coupling as may occur in conventional designs. Further, because of the need for such mobile devices to be capable of working at a variety of different frequency bands and modulation schemes, and at low power loss, it is desirable for such RFFE's to be tunable over a wide variety of frequencies and to have low losses.

This disclosure describes a high performance integrated tunable impedance matching network with coupled merged inductors. More particularly, embodiments of the invention include a combination of merged coupled spiral inductors and tunable capacitor elements. This design reduces insertion losses, circuit size, and optimization time while maintaining a high Q factor for the coupled spiral inductors.

One embodiment is a tunable impedance matching network including: a multi-port spiral inductor having an input port and at least two output ports; a first tunable capacitor electrically connected in a shunt configuration from a first one of the at least two output ports of the multi-port spiral inductor to circuit ground; and a second tunable capacitor electrically connected in a shunt configuration from a second one of the at least two output ports of the multi-port spiral inductor to circuit ground.

Another embodiment is a tunable impedance matching network including: a coupled merged inductor having an input port and at least two output ports; a first tunable capacitor electrically connected in a shunt configuration from a first one of the at least two output ports of the coupled merged inductor to circuit ground; and a second tunable capacitor electrically connected in a shunt configuration from a second one of the at least two output ports of the coupled merged inductor to circuit ground.

Yet another embodiment is an integrated circuit tunable impedance matching network for tuning radio frequencies, including: a multi-port spiral inductor having an input port and at least two output ports; a first digitally tunable capacitor electrically connected in a shunt configuration from a first one of the at least two output ports of the multi-port spiral inductor to circuit ground; and a second digitally tunable capacitor electrically connected in a shunt configuration from a second one of the at least two output ports of the multi-port spiral inductor to circuit ground.

The invention includes various corresponding and associated methods.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Multi-mode, multi-band integrated circuit RFFE's are commonly used in mobile devices. As a result, impedance matching (IM) networks with multiple inductors can be found in many places in such RFFEs, for example, for antenna and power amplifier impedance matching. Accordingly, it is desirable to shrink the die size, reduce the cost, and simplify the design of IC's embodying such RFFE's while maintaining high performance and without the adverse effects of mutual inductive coupling as may occur in conventional designs. Further, because of the need for such mobile devices to be capable of working at a variety of different frequency bands and modulation schemes, and at low power loss, it is desirable for such RFFE's to be tunable over a wide variety of frequencies and to have low losses.

This disclosure describes a high performance integrated tunable impedance matching network with coupled merged inductors. More particularly, embodiments of the invention include a combination of merged coupled spiral inductors and tunable capacitor elements. This design reduces insertion losses, circuit size, and optimization time while maintaining a high Q factor for the coupled spiral inductors.

Figure 3:
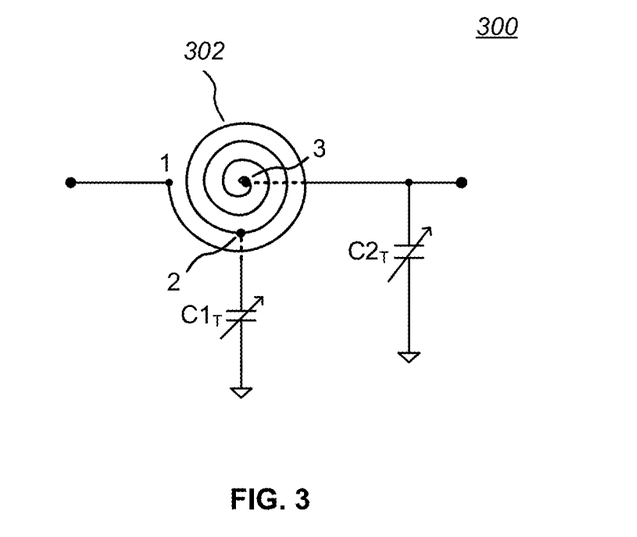
FIG. 3 is schematic diagram showing one embodiment of an impedance matching network in accordance with the present invention.
Figure 4:
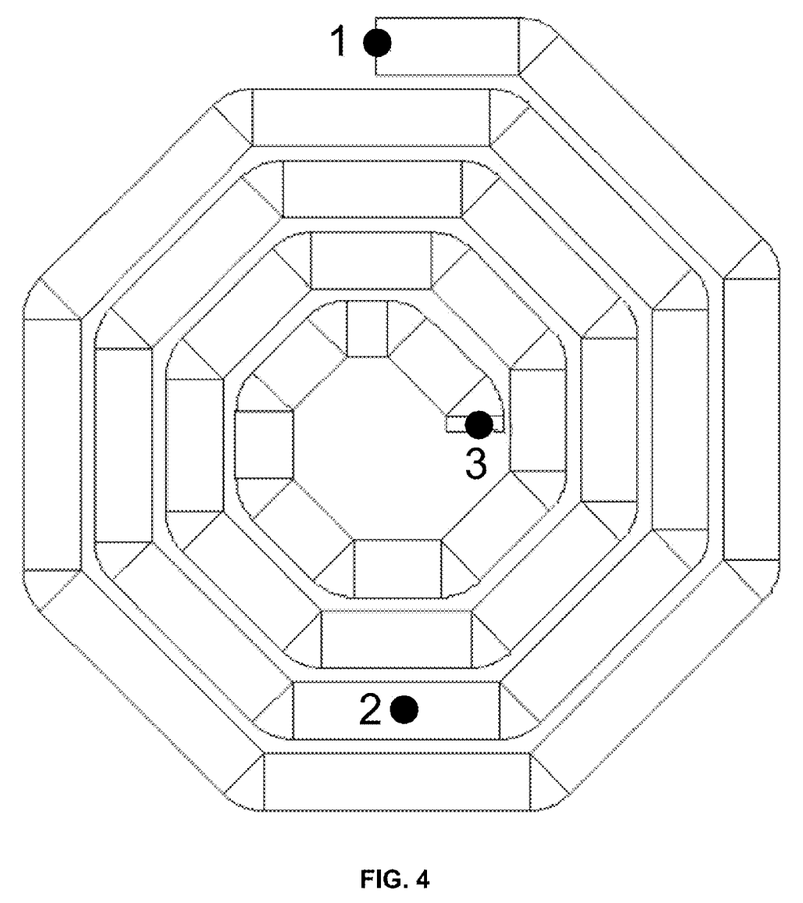
FIG. 4 is a diagram of one spiral inductor structure suitable for fabrication as part of an integrated circuit.

FIG. 3 is schematic diagram showing one embodiment of an impedance matching network 300 in accordance with the present invention. The structure of the IM network 300 is similar to the structure shown in FIG. 2, except that the two separate inductors L1s, L2s in FIG. 2 have been replaced by a single multi-port spiral inductor 302. FIG. 4 is a diagram of one multiport spiral inductor structure 400 suitable for fabrication as part of an integrated circuit; in the illustrated embodiment, the spiral inductor structure 400 has three ports (1, 2, 3) and can function as two inductors (e.g., $L1s'$=the inductance from port 1 to port 2, and $L2s'$=the inductance from port 2 to port 3). Other embodiments may include additional output ports so that the inductor structure 400 may function as more than two inductors. As should be apparent, using a single multi-port spiral inductor 302—effectively comprising "merged" inductors—in place of separate spiral inductors (e.g., L1s, L2s in FIG. 2) generally results in a smaller amount of die space consumption for the total inductor structure.

Referring again to FIG. 3, the IM network 300 includes tunable capacitors $C1_T$, $C2_T$ in addition to the multi-port spiral inductor 302. The tunable capacitors $C1_T$, $C2_T$ are electrically connected in a shunt configuration from respective output ports (2, 3) of the multi-port spiral inductor 302 to circuit ground, as shown. Suitable (and often preferable) tunable capacitors $C1_T$, $C2_T$ are the digitally tunable capacitors (DTCs) taught in U.S. Patent Publication No. 20110002080 A1, filed Mar. 2, 2009, entitled "Method and Apparatus for use in Digitally Tuning a Capacitor in an Integrated Circuit Device", assigned to the assignee of the present application, the contents of which are incorporated in this application by reference as if set forth in full. Using tunable capacitors $C1_T$, $C2_T$ allows tuning of the IM network 300 over a wide range of frequencies.

As should be apparent to one of skill in the art, other components (e.g., resistors, fixed capacitors, inductors) may be coupled or connected to the multi-port spiral inductor 302 and/or to the tunable capacitors $C1_T$, $C2_T$. For example, additional fixed capacitors may be added between various tapping points on the multi-port spiral inductor 302 to create additional shaping of the frequency response (e.g., creating notches at harmonic frequencies or otherwise shaping the frequency response).

Given very limited die space, the mutual coupling effect between conventional inductors is difficult to avoid; with a multi-port spiral inductor, mutual coupling is unavoidable. However, it was discovered that mutual constructive coupling can be an advantage in embodiments of the present invention. In particular, the major advantage is a higher Q factor, which results in a lower insertion loss, as discussed in greater detail below.

Figure 5:
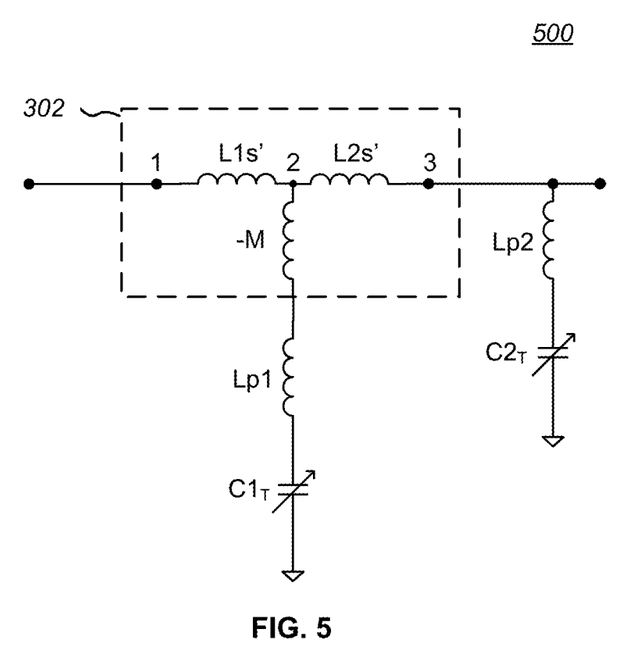
FIG. 5 is a diagram of an equivalent circuit for the IM network embodiment shown in FIG. 3.

FIG. 5 is a diagram of an equivalent circuit 500 for the IM network 300 embodiment shown in FIG. 3. The multi-port spiral inductor 302 is shown modeled as three inductances: $L1s'$ is the inductance from port 1 to port 2 of the multi-port spiral inductor 302; $L2s'$ is the inductance from port 2 to port 3 of the multi-port spiral inductor 302; and $-M$ is a negative mutual inductance created by the mutual constructive interaction of inductors $L1s'$ and $L2s'$.

Also shown in FIG. 5 are the tunable capacitors $C1_T$, $C2_T$ coupled to the multi-port spiral inductor 302. In the equivalent circuit 500, each tunable capacitor $C1_T$, $C2_T$ has an associated parasitic inductance Lp1, Lp2. Such parasitic inductances arise from the self-inductance of the tunable capacitors $C1_T$, $C2_T$ and from interaction of the components and electrical connections of the tunable capacitors C1$_T$, C2$_T$ with nearby components and connections (e.g., flip chip solder bumps). Parasitic inductances are generally detrimental to the performance of conventional circuits and must be minimized for optimum circuit performance (especially for C1$_T$), usually by employing careful layout techniques and minimizing electrical distance between components. However, in embodiments of the present invention, the negative inductance −M of the multi-port spiral inductor 302 equivalent circuit in series with C1$_T$ (which is preferably a DTC) cancels out at least some of the parasitic inductance Lp1 which would otherwise hurt performance of the IM network 300 as a whole. The value of −M can be designed to maintain good impedance coverage compared to conventional designs which use physically separate inductors. Depending on desired circuit parameters and performance criteria, the value of −M can be selected to cancel out the parasitic tunable capacitor inductance Lp1 either completely (i.e., −M+Lp1≈0) or partially (e.g., such that there is a net negative inductance remaining (i.e., −M+Lp1<0), or a net positive inductance remaining (i.e., −M+Lp1>0). Utilizing the negative inductance −M of the multi-port spiral inductor 302 equivalent circuit allows the parasitic inductance Lp1 of tunable capacitor C1$_T$ to be reduced or eliminated without unduly constraining the layout and distance between components of the IM network 300 as a whole.

Figure 6A:
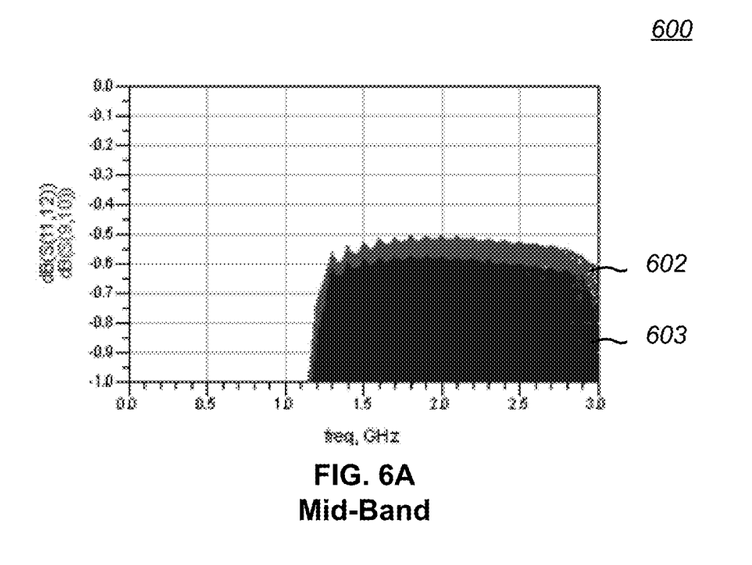
FIG. 6A is a graph showing a plot of insertion loss versus frequency for a mid-band example embodiment of a single multi-port spiral inductor IM network in accordance with the present invention compared to a conventional mid-band dual inductor IM network circuit.
Figure 6B:
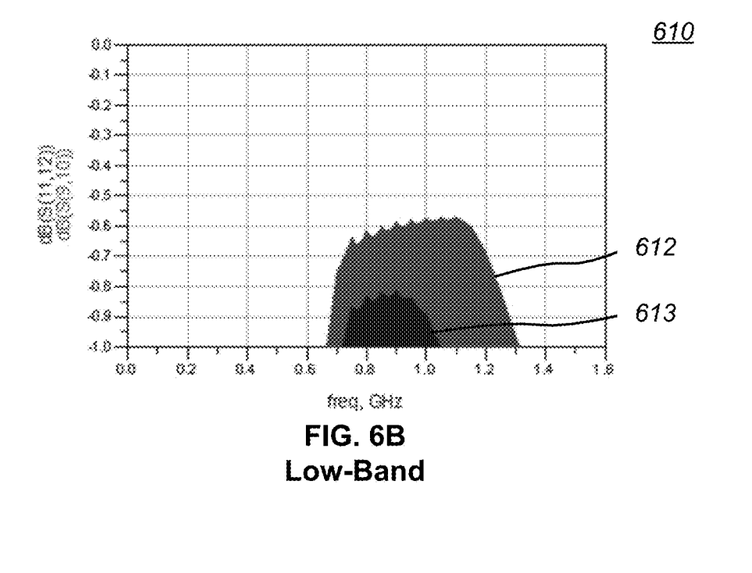
FIG. 6B is a graph showing a plot of insertion loss versus frequency for a low-band example embodiment of a single multi-port spiral inductor IM network in accordance with the present invention compared to a conventional low-band dual inductor IM network circuit.

Further, integrated tunable impedance matching network embodiments using coupled merged inductors exhibit lower insertion loss and wider bandwidths in simulations. For example, FIG. 6A is a graph 600 showing a plot of insertion loss versus frequency for a mid-band example embodiment 602 of a single multi-port spiral inductor IM network 300 in accordance with the present invention compared to a conventional mid-band dual inductor IM network circuit 603. Similarly, FIG. 6B is a graph 610 showing a plot of insertion loss versus frequency for a lowband example embodiment 612 of a single multi-port spiral inductor IM network 300 in accordance with the present invention compared to a conventional low-band dual inductor IM network circuit 613. In both cases, the circuit response was simulated using HFSS, a commercial simulation program from ANSYS, Inc., and the tuning capacitors C1$_T$ and C2$_T$ were assumed to have infinite Q; similar results were achieved using simulation programs from Sonnet Software, Inc. (Sonnet) and from Advanced Design System (MoM).

As the graphs 600, 610 illustrate, the example embodiments 602, 604 of a multi-port spiral inductor IM network 300 exhibited lower insertion losses (IL) in the simulations compared to conventional designs: about 0.1 dB better for the mid-band embodiment and about 0.2 dB better for the low-band embodiment. While seemingly small, these lower IL figures are significant in the context of an RFFE. In addition, the example embodiments 602, 604 exhibited wider bandwidths compared to conventional designs.

Figure 7:
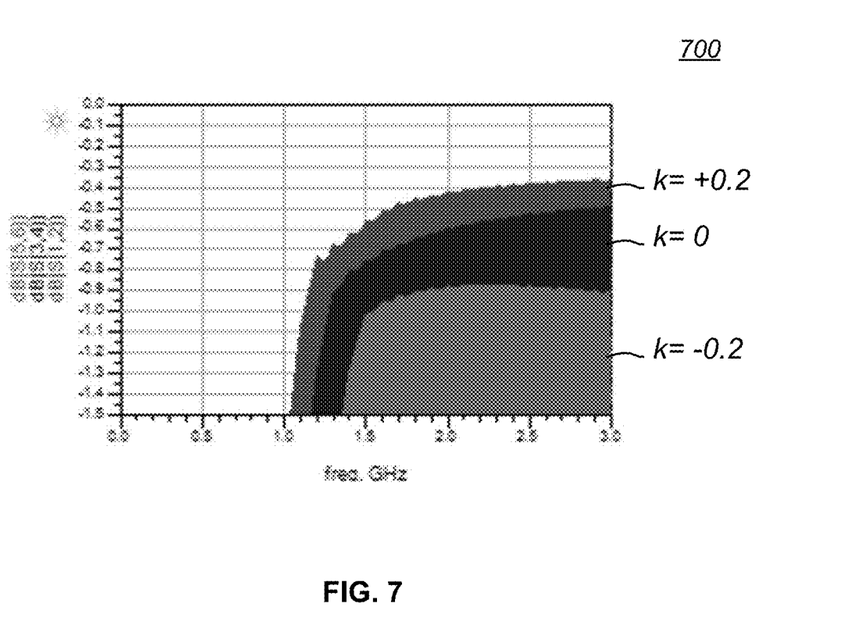
FIG. 7 is a graph showing insertion loss versus frequency for three different coupling coefficients with respect to one simulated embodiment of the invention.

To ensure that the mutual interaction of inductors L1$s$' and L2$s$' of the multi-port spiral inductor 302 is constructive, the multi-port spiral inductor 302 should be designed to have a positive coupling coefficient k:

$$k = \frac{M}{\sqrt{L_1 \cdot L_2}} \quad \text{EQ. 1}$$

where L$_1$ and L$_2$ are the self-inductances of two inductors, and M is the mutual or coupling inductance between the same two inductors. It has been shown in simulations that, for the midband example embodiment 602 described above, a coupling coefficient k=+0.2 exhibits less insertion loss than coefficients of zero or −0.2 when all other component parameters are the same. For example, FIG. 7 is a graph 700 showing insertion loss versus frequency for three different coupling coefficients (k=+0.2, k=0, k=−0.2) with respect to one simulated embodiment of the invention. In general, it is expected that positive coupling coefficients will exhibit less insertion loss than non-positive coupling coefficients.

One of the challenges for a tunable integrated IM network is achieving a high Q factor for the inductors. In particular, it is important to design a multi-port spiral inductor 302 to have a high Q factor. For the equivalent circuit 500 of the IM network shown in FIG. 5, $$Q_{1,2} = \frac{jw(L_{1,2} + M)}{R_{1,2}} \quad \text{EQ. 2}$$

where L$_{1,2}$ is the self-inductance of the L1$s$' and L2$s$' branches of the spiral inductor 302, M is the mutual inductance of L1$s$' and L2$s$', and R$_{1,2}$ is the effective series resistance of the L1$s$' and L2$s$' branches, respectively.

The inductive characteristics of a multi-port spiral inductor 302 can be controlled through the spacing of its windings and the diameter of its loops. Narrower spacing increases coupling, provides higher Q, and saves die area; larger loops result in higher Q. Use of precision IC manufacturing techniques provides tight control over both of these design aspects. However, the exact determination of these parameters is design dependent, since numerous other factors (e.g., adjacent circuitry, target frequency bands, fabrication process, power levels, etc.) may affect particular multi-port spiral inductor designs.

Another aspect of the invention includes a method for configuring a tunable impedance matching network, including the steps of:

STEP 1: providing a coupled merged inductor (e.g., a multi-port spiral inductor) having an input port and at least two output ports;

STEP 2: coupling a first tunable capacitor electrically connected in a shunt configuration from a first one of the at least two output ports of the coupled merged inductor to circuit ground; and STEP 3: coupling a second tunable capacitor electrically connected in a shunt configuration from a second one of the at least two output ports of the coupled merged inductor to circuit ground The described method can be extended to include to manufacturing the tunable impedance matching network as an integrated circuit, using digitally tunable capacitors for one or both of the first tunable capacitor and the second tunable capacitor, limiting the coupled merged inductor to only two output ports, and configuring the tunable impedance matching network for tuning radio frequencies.

Benefits of an integrated tunable impedance matching network using coupled merged inductors include: (1) a reduction in IC die area due to merging inductors in a multiport-spiral topology; (2) a general reduction in the required total inductance value (from taking advantage of mutual constructive inductance) to achieve the same Smith chart coverage; (3) lower insertion losses; and (4) wider bandwidth. Applications of such an integrated tunable IM network include: tunable output matching networks (OMN) for power amplifiers; tunable input matching networks (IMN) for antenna tuning; an integrated inductor for a low noise amplifiers (LNAs); and a tunable filter using coupled integrated inductors.

As should be apparent to one of skill in the art, other components (e.g., resistors, additional capacitors and inductors, active devices, etc.) may be coupled or connected to the various circuit elements of embodiments of the impedance matching network described above to meet particular design needs.

A number of embodiments of the invention have been described. It is to be understood that various modifications may be made without departing from the spirit and scope of the invention. For example, some of the steps described above may be order independent, and thus can be performed in an order different from that described. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A tunable impedance matching network including:
   (a) a multi-port spiral coupled merged inductor fabricated as a single integrated circuit structure having an input port and at least two output ports and configured such that the multi-port spiral coupled merged inductor functions as at least two inductors (1) connected at an intermediate junction defining an associated output port, and (2) having a mutual inductance value created by a mutual constructive interaction of the at least two inductors;
   (b) a first tunable capacitor electrically connected in a shunt configuration from the junction between at least two output ports of the multi-port spiral coupled merged inductor to circuit ground, the first tunable capacitor having an associated parasitic inductance value; and
   (c) a second tunable capacitor electrically connected in a shunt configuration from a second one of the at least two output ports of the multi-port spiral coupled merged inductor to circuit ground;
   wherein the multi-port spiral coupled merged inductor and the first tunable capacitor are configured such that the mutual inductance value of the multi-port spiral coupled merged inductor at least partially cancels out the parasitic inductance value associated with the first tunable capacitor.

2. The tunable impedance matching network of claim 1, wherein the tunable impedance matching network is manufactured as an integrated circuit.

3. The tunable impedance matching network of claim 1, wherein at least one of the first tunable capacitor and the second tunable capacitor is a digitally tunable capacitor.

4. The tunable impedance matching network of claim 1, wherein the multi-port spiral coupled merged inductor has only two output ports.

5. The tunable impedance matching network of claim 1, wherein the tunable impedance matching network is configured for tuning radio frequencies.

6. The tunable impedance matching network of claim 1, wherein the multi-port spiral coupled merged inductor has a positive coupling coefficient.

7. The tunable impedance matching network of claim 1, wherein the multi-port spiral coupled merged inductor and the first tunable capacitor are configured such that the mutual inductance value of the multi-port spiral coupled merged inductor approximately completely cancels out the parasitic inductance value associated with the first tunable capacitor.

8. A tunable impedance matching network including:
   (a) a multi-port spiral inductor fabricated as a single integrated circuit structure having an input port and at least two output ports configured such that the multi-port spiral inductor functions as at least two inductors (1) connected at an intermediate junction defining an associated output port, and (2) having a mutual inductance value created by a mutual constructive interaction of the at least two inductors;
   (b) a first tunable capacitor electrically connected in a shunt configuration from the junction between at least two output ports of the multi-port spiral inductor to circuit ground, the first tunable capacitor having an associated parasitic inductance value; and
   (c) a second tunable capacitor electrically connected in a shunt configuration from a second one of the at least two output ports of the multi-port spiral inductor to circuit ground;
   wherein the multi-port spiral inductor and the first tunable capacitor are configured such that the mutual inductance value of the multi-port spiral inductor at least partially cancels out the parasitic inductance value associated with the first tunable capacitor.

9. The tunable impedance matching network of claim 8, wherein the tunable impedance matching network is manufactured as an integrated circuit.

10. The tunable impedance matching network of claim 8, wherein at least one of the first tunable capacitor and the second tunable capacitor is a digitally tunable capacitor.

11. The tunable impedance matching network of claim 8, wherein the multi-port spiral inductor has only two output ports.

12. The tunable impedance matching network of claim 8, wherein the tunable impedance matching network is configured for tuning radio frequencies.

13. The tunable impedance matching network of claim 8, wherein the multi-port spiral inductor has a positive coupling coefficient.

14. The tunable impedance matching network of claim 8, wherein the multi-port spiral inductor and the first tunable capacitor are configured such that the mutual inductance value of the multi-port spiral inductor approximately completely cancels out the parasitic inductance value associated with the first tunable capacitor.

15. A tunable impedance matching network including:
   (a) a multi-port spiral coupled merged inductor fabricated as a single integrated circuit structure having at least three ports, configured such that the multi-port spiral coupled merged inductor functions as at least two inductors (1) connected at an intermediate junction defining an associated port, and (2) having a mutual inductance value created by a mutual constructive interaction of the at least two inductors, at least one such port configured to receive an input signal and at least one other such port configured to output an impedance matched output signal;
   (b) a first tuning circuit electrically connected to a junction between a first one and a second one of the at least three ports of the multi-port spiral coupled merged inductor, the first tuning circuit having an associated parasitic inductance value; and
   (c) a second tuning circuit electrically connected to a third one of the at least three ports of the multi-port spiral coupled merged inductor;

wherein the multi-port spiral coupled merged inductor and the first tuning circuit are configured such that the mutual inductance value of the multi-port spiral coupled merged inductor at least partially cancels out the parasitic inductance value associated with the first tuning circuit.

16. The tunable impedance matching network of claim 15, wherein the tunable impedance matching network is manufactured as an integrated circuit.

17. The tunable impedance matching network of claim 15, wherein at least one of the first tuning circuit and the second tuning circuit is a digitally tunable capacitor.

18. The tunable impedance matching network of claim 15, wherein the tunable impedance matching network is configured for tuning radio frequencies.

19. The tunable impedance matching network of claim 15, wherein the multi-port spiral coupled merged inductor has a positive coupling coefficient.

20. The tunable impedance matching network of claim 15, wherein the multi-port spiral coupled merged inductor and the first tuning circuit are configured such that the mutual inductance value of the multi-port spiral coupled merged inductor approximately completely cancels out the parasitic inductance value associated with the first tuning circuit.

21. An integrated circuit tunable impedance matching network for tuning radio frequencies, including:
  (a) a multi-port spiral inductor fabricated as a single integrated circuit structure having an input port and at least two output ports, configured such that the multi-port spiral inductor functions as at least two inductors (1) connected at an intermediate junction defining an associated output port, (2) having a mutual inductance value created by a mutual constructive interaction of the at least two inductors, and (3) having a positive coupling coefficient;
  (b) a first digitally tunable capacitor electrically connected in a shunt configuration from the junction between at least two output ports of the multi-port spiral inductor to circuit ground, the first digitally tunable capacitor having an associated parasitic inductance value; and
  (c) a second digitally tunable capacitor electrically connected in a shunt configuration from a second one of the at least two output ports of the multi-port spiral inductor to circuit ground;
  wherein the multi-port spiral inductor and the first and second digitally tunable capacitors are configured to tune radio frequencies, and
  wherein the multi-port spiral inductor and the first digitally tunable capacitor are configured such that the mutual inductance value of the multi-port spiral inductor at least partially cancels out the parasitic inductance value associated with the first digitally tunable capacitor.

22. The integrated circuit tunable impedance matching network of claim 21, wherein the multi-port spiral inductor and the first digitally tunable capacitor are configured such that the mutual inductance value of the multi-port spiral inductor approximately completely cancels out the parasitic inductance value associated with the first digitally tunable capacitor.

23. A method for configuring a tunable impedance matching network, including the steps of:
  (a) providing a multi-port spiral coupled merged inductor fabricated as a single integrated circuit structure having an input port and at least two output ports, configured such that the multi-port spiral coupled merged inductor functions as at least two inductors (1) connected at an intermediate junction defining an associated output port, and (2) having a mutual inductance value created by a mutual constructive interaction of the at least two inductors;
  (b) coupling a first tunable capacitor electrically connected in a shunt configuration from the junction between at least two output ports of the multi-port spiral coupled merged inductor to circuit ground, the first tunable capacitor having an associated parasitic inductance value;
  (c) coupling a second tunable capacitor electrically connected in a shunt configuration from a second one of the at least two output ports of the multi-port spiral coupled merged inductor to circuit ground; and
  (d) configuring the multi-port spiral coupled merged inductor and the first tunable capacitor such that the mutual inductance value of the multi-port spiral coupled merged inductor at least partially cancels out the parasitic inductance value associated with the first tunable capacitor.

24. The method of claim 23, further including manufacturing the tunable impedance matching network as an integrated circuit.

25. The method of claim 23, wherein at least one of the first tunable capacitor and the second tunable capacitor is a digitally tunable capacitor.

26. The method of claim 23, wherein the multi-port spiral coupled merged inductor has only two output ports.

27. The method of claim 23, further including configuring the tunable impedance matching network for tuning radio frequencies.

28. The method of claim 23, wherein the multi-port spiral coupled merged inductor has a positive coupling coefficient.

29. The method of claim 23, wherein the multi-port spiral coupled merged inductor and the first tunable capacitor are configured such that the mutual inductance value of the multi-port spiral coupled merged inductor approximately completely cancels out the parasitic inductance value associated with the first tunable capacitor.

30. A method for configuring a tunable impedance matching network, including the steps of:
  (a) providing a multi-port spiral inductor fabricated as a single integrated circuit structure having an input port and at least two output ports configured such that the multi-port spiral inductor functions as at least two inductors (1) connected at an intermediate junction defining an associated output port, and (2) having a mutual inductance value created by a mutual constructive interaction of the at least two inductors;
  (b) coupling a first tunable capacitor electrically connected in a shunt configuration from the junction between at least two output ports of the multi-port spiral inductor to circuit ground, the first tunable capacitor having an associated parasitic inductance value;
  (c) coupling a second tunable capacitor electrically connected in a shunt configuration from a second one of the at least two output ports of the multi-port spiral inductor to circuit ground; and
  (d) configuring the multi-port spiral inductor and the first tunable capacitor such that the mutual inductance value of the multi-port spiral inductor at least partially cancels out the parasitic inductance value associated with the first tunable capacitor.

31. The method of claim 30, further including manufacturing the tunable impedance matching network as an integrated circuit.

32. The method of claim 30, wherein at least one of the first tunable capacitor and the second tunable capacitor is a digitally tunable capacitor.

33. The method of claim 30, wherein the multi-port spiral inductor has only two output ports.

34. The method of claim 30, further including configuring the tunable impedance matching network for tuning radio frequencies.

35. The method of claim 30, wherein the multi-port spiral inductor has a positive coupling coefficient.

36. The method of claim 30, wherein the multi-port spiral inductor and the first tunable capacitor are configured such that the mutual inductance value of the multi-port spiral inductor approximately completely cancels out the parasitic inductance value associated with the first tunable capacitor.

37. A method for configuring an integrated circuit tunable impedance matching network for tuning radio frequencies, including the steps of:
  (a) providing a multi-port spiral inductor fabricated as a single integrated circuit structure having an input port and at least two output ports, configured such that the multi-port spiral inductor functions as at least two inductors (1) connected at an intermediate junction defining an associated output port, (2) having a mutual inductance value created by a mutual constructive interaction of the at least two inductors, and (3) having a positive coupling coefficient;
  (b) coupling a first digitally tunable capacitor electrically connected in a shunt configuration from of the junction between at least two output ports of the multi-port spiral inductor to circuit ground, the first digitally tunable capacitor having an associated parasitic inductance value;
  (c) coupling a second digitally tunable capacitor electrically connected in a shunt configuration from a second one of the at least two output ports of the multi-port spiral inductor to circuit ground;
  (d) configuring the multi-port spiral inductor and the first and second digitally tunable capacitors to tune radio frequencies; and
  (e) configuring the multi-port spiral inductor and the first digitally tunable capacitor such that the mutual inductance value of the multi-port spiral inductor at least partially cancels out the parasitic inductance value associated with the first digitally tunable capacitor.

38. The method of claim 37, wherein the multi-port spiral inductor and the first digitally tunable capacitor are configured such that the mutual inductance value of the multi-port spiral inductor approximately completely cancels out the parasitic inductance value associated with the first digitally tunable capacitor.

* * * * *